(12) United States Patent
Chang et al.

(10) Patent No.: US 10,937,659 B2
(45) Date of Patent: Mar. 2, 2021

(54) METHOD OF ANISOTROPICALLY ETCHING ADJACENT LINES WITH MULTI-COLOR SELECTIVITY

(71) Applicant: Tokyo Electron Limited, Tokyo (JP)

(72) Inventors: Shihsheng Chang, Albany, NY (US); Andrew Metz, Albany, NY (US)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/542,983

(22) Filed: Aug. 16, 2019

(65) Prior Publication Data

US 2020/0328086 A1    Oct. 15, 2020

Related U.S. Application Data

(60) Provisional application No. 62/831,467, filed on Apr. 9, 2019.

(51) Int. Cl.
| | |
|---|---|
| H01L 21/306 | (2006.01) |
| H01L 21/311 | (2006.01) |
| H01L 21/3065 | (2006.01) |
| H01L 21/3105 | (2006.01) |
| H01L 21/308 | (2006.01) |
| B81C 1/00 | (2006.01) |

(52) U.S. Cl.
CPC .... H01L 21/30608 (2013.01); B81C 1/00595 (2013.01); H01L 21/3065 (2013.01); H01L 21/3081 (2013.01); H01L 21/311 (2013.01); H01L 21/31053 (2013.01); H01L 21/31116 (2013.01); H01L 21/31127 (2013.01)

(58) Field of Classification Search
CPC .......... H01L 21/30608; H01L 21/3065; H01L 21/31053; H01L 21/31116; H01L 21/31127; H01L 21/3081; H01L 21/311; B81C 1/00595
USPC ................................................ 438/710–714
See application file for complete search history.

(56) References Cited

U.S. PATENT DOCUMENTS

| | | | |
|---|---|---|---|
| 2009/0104764 A1* | 4/2009 | Xia | H01L 21/0214 438/595 |
| 2017/0294319 A1* | 10/2017 | Ogiwara | H01L 21/31116 |
| 2018/0174860 A1* | 6/2018 | Kanarik | H01L 21/6831 |

(Continued)

*Primary Examiner* — Duy Vu N Deo
(74) *Attorney, Agent, or Firm* — Rothwell, Figg, Ernst & Manbeck, P.C.

(57) ABSTRACT

Embodiments provide anisotropic etch processes for silicon carbon nitride (SiCN) or other materials within multi-color structures with improved selectivity to materials in adjacent lines. Cyclic surface modification and activation processes are used to achieve an anisotropic etch with desired selectivity with respect to other materials in a multi-color structure. For example embodiments, selectivity of a first material, such as SiCN or silicon nitride, with respect to other materials in adjacent lines for the multi-color structure is achieved using the cyclic modification/activation processes. The materials within the multi-color structure can include, for example, silicon, silicon nitride, silicon carbon oxide, silicon oxide, titanium nitride, and/or other materials. For one embodiment, hydrogen is introduced to process chemistry to facilitate the surface modification. For one embodiment, a non-corrosive gas, such as nitrogen trifluoride, is included in the process chemistry with the hydrogen.

24 Claims, 6 Drawing Sheets

(56) References Cited

U.S. PATENT DOCUMENTS

2018/0330958 A1\* 11/2018 Kumakura .......... H01L 21/0337
2020/0027740 A1\* 1/2020 Vervuurt ................. C30B 33/12

\* cited by examiner

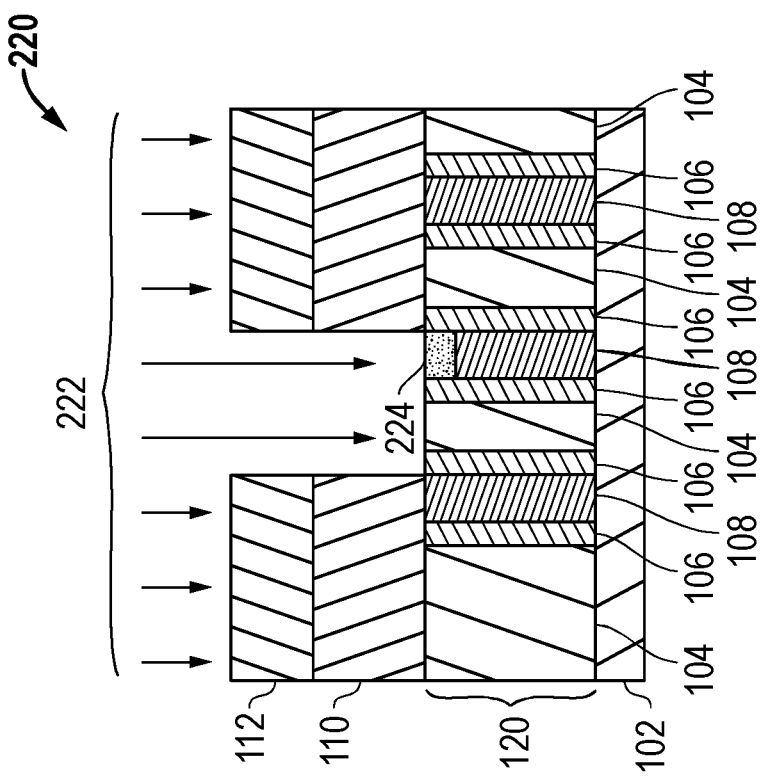
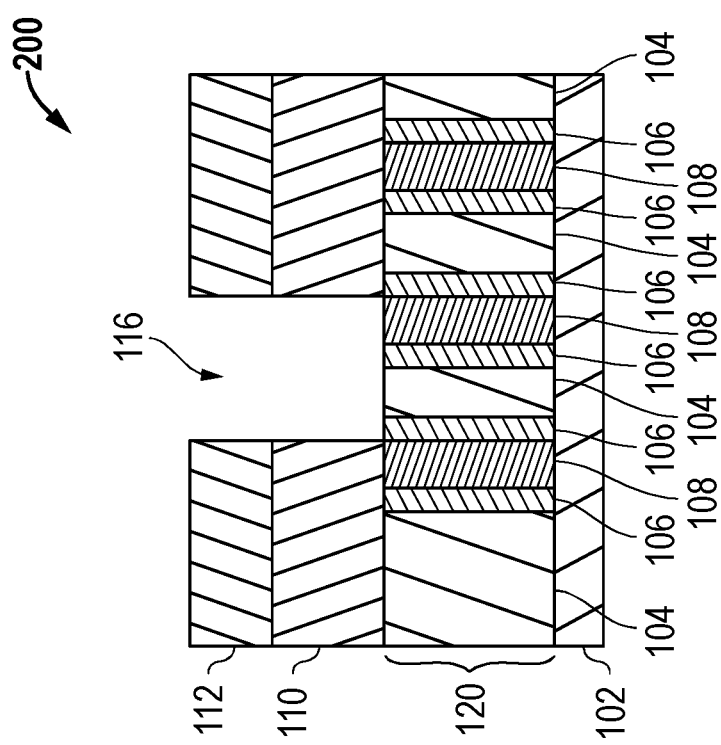
FIG. 2A
FIG. 2B

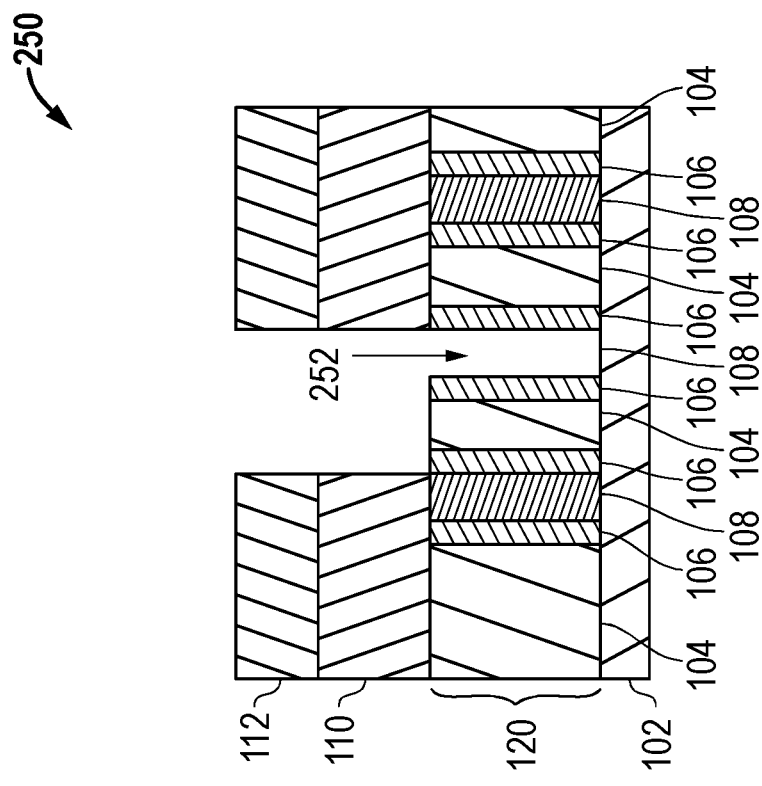
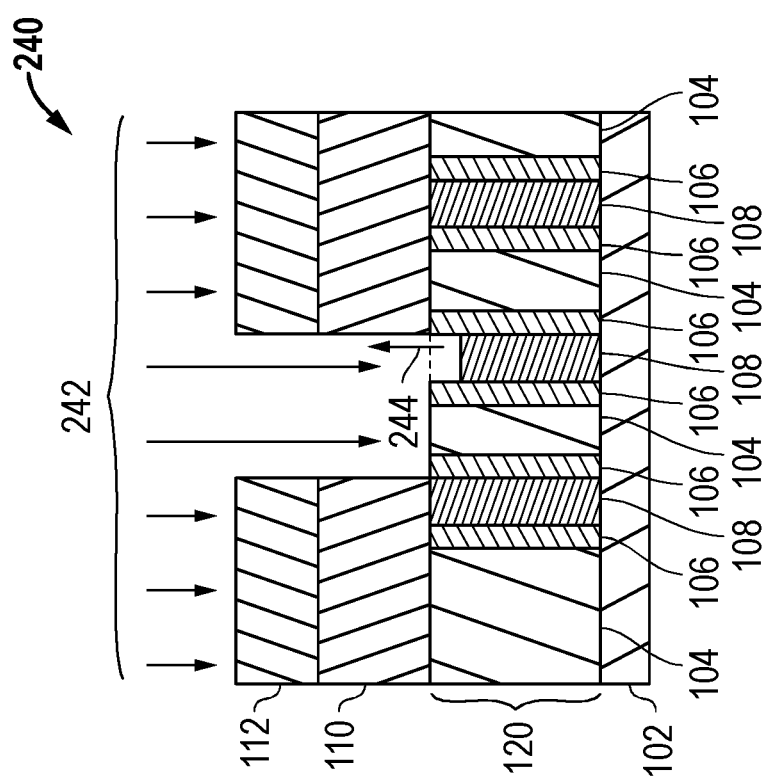

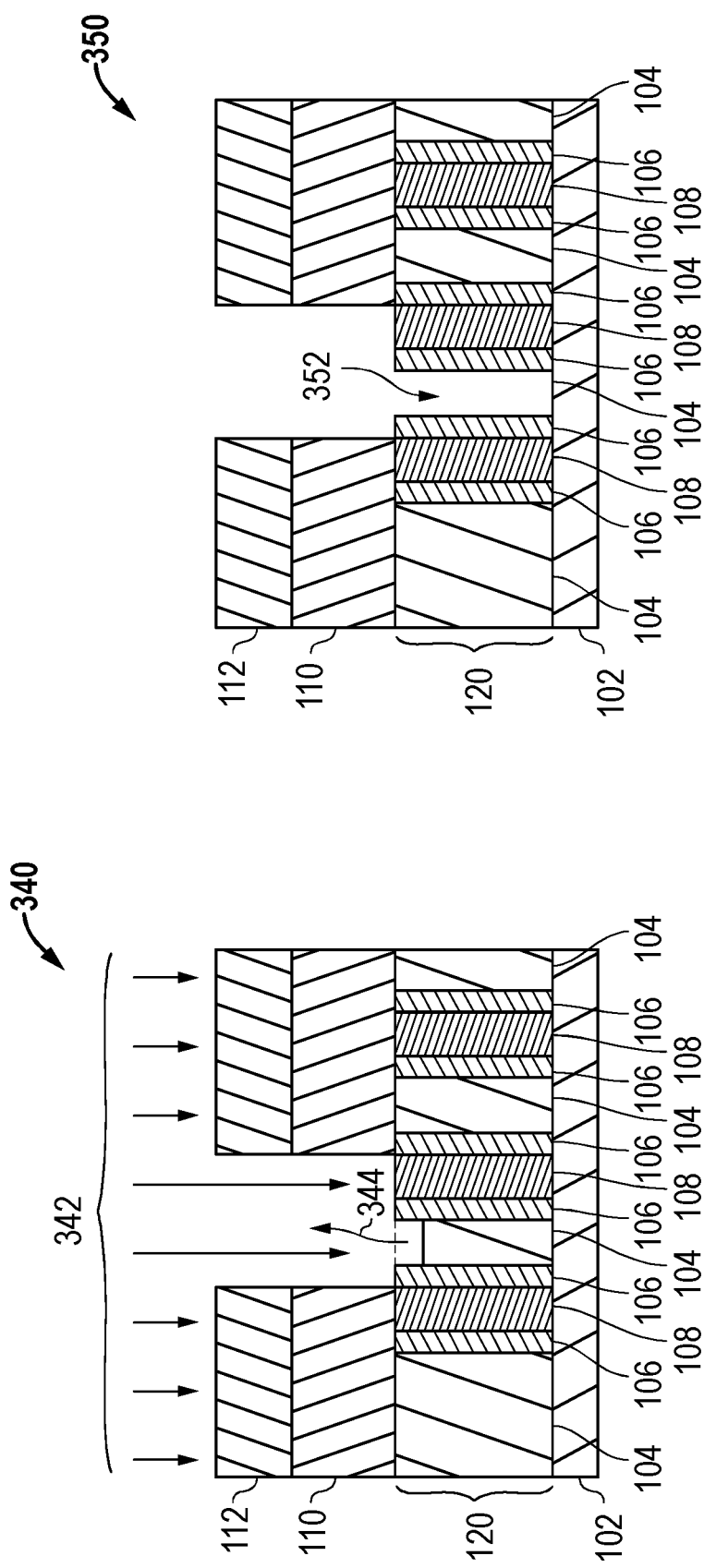

METHOD OF ANISOTROPICALLY ETCHING ADJACENT LINES WITH MULTI-COLOR SELECTIVITY

RELATED APPLICATIONS

This application claims priority to the following provisional application: U.S. Provisional Patent Application Ser. No. 62/831,467 filed Apr. 9, 2019, and entitled "A Method of Anisotropically Etching SiCN with Multi-Color Selectivity," which is hereby incorporated by reference in its entirety.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, process flows are being requested to reduce feature size while maintaining structure integrity for various patterning processes.

One technique to reduce feature size beyond what is available from lithography alone is a multi-color technique for materials in adjacent lines formed on a substrate for a microelectronic workpiece being processed. For this multi-color technique, adjacent lines for device features are formed with materials having different etch selectivity with respect to process chemistries. In an ideal solution, these different materials can then be selectively etched using one or more process steps with reduced concern over edge placement error. Because the different materials are shown in different colors for design purposes, the term "multi-color" is often used to refer to the adjacent materials and structures used for these techniques.

One difficulty with multi-color material techniques in real-world solutions, however, is achieving selective and anisotropic etch processes for adjacent lines of different materials within a multi-color structure. For example, selective and anisotropic etches are particularly difficult with respect to silicon carbon nitride (SiCN) in multi-color structures. Selective and anisotropic etches are also difficult for other materials within multi-color structures.

SUMMARY

Embodiments are described herein that provide anisotropic etch processes for silicon carbon nitride (SiCN) or other materials with improved selectivity for multi-color material processing techniques. Disclosed embodiments use cyclic surface modification and activation processes to achieve an anisotropic etch with desired selectivity of a first material with respect to other materials. For one embodiment, SiCN is etched anisotropically with selectivity to other materials in a multi-color structure. Materials within the multi-color structure can include, for example, silicon, silicon nitride, silicon carbon oxide (SiCO), silicon oxide ($SiO_2$), titanium nitride (TiN), and/or other materials. For one embodiment, hydrogen is introduced to the process chemistry to facilitate the surface modification. For one embodiment, the process chemistry for the surface modification process can include a non-corrosive gas, such as nitrogen trifluoride ($NF_3$). Different or additional features, variations, and embodiments can also be implemented, and related systems and methods can be utilized as well.

For one embodiment, a method is disclosed including providing a multi-color structure formed on an underlying layer and performing a cyclic etch. The multi-color structure includes 1 adjacent lines of materials. The cyclic etch includes modifying a surface region of a first material within the adjacent lines to form a modified surface material, activating the modified surface material to remove the modified surface material, and repeating the modifying and activating for a number of cycles to etch the first material. The cyclic etch achieves an anisotropic etch of the first material with selectivity to other materials within the adjacent lines.

In additional embodiments, the number of cycles is selected to achieve a target etch amount for the first material. In further embodiments, the number of cycles is greater than or equal to fifty.

In additional embodiments, the first material includes silicon carbon nitride. In further embodiments, the selectivity of the silicon carbon nitride to the other materials within the adjacent lines is greater than four. In still further embodiments, the other materials within the adjacent lines include at least one or more of silicon, silicon nitride, silicon carbon oxide, silicon oxide, and titanium nitride.

In additional embodiments, the process chemistry for the activating includes at least one of nitrogen, argon, or another noble gas. In additional embodiments, the modified surface material comprises a salt.

In additional embodiments, the modifying uses a process chemistry comprising hydrogen. In further embodiments, the process chemistry for the modifying further includes a fluorine-based gas. In still further embodiments, the fluorine-based gas is nitrogen trifluoride (NF3), and a percentage of the hydrogen (H2) within the process chemistry is greater than or equal to 50% with respect to an amount of the nitrogen trifluoride (NF3) within the process chemistry such that H2/(H2+NF3)≥0.5.

For one embodiment, a method is disclosed to etch silicon carbon nitride (SiCN) in a multi-color structure including providing a multi-color structure formed on an underlying layer and performing a cyclic etch. The multi-color structure includes adjacent lines of materials including SiCN. The cyclic etch includes modifying a surface region of the SiCN within the adjacent lines to form a modified surface material using process chemistry including hydrogen, activating the modified surface material to remove the modified surface material, and repeating the modifying and activating for a number of cycles to etch the SiCN. The cyclic etch achieves an anisotropic etch of the SiCN with selectivity to other materials within the adjacent lines.

In additional embodiments, the number of cycles is selected to achieve a target etch amount for the SiCN. In additional embodiments, the selectivity of the SiCN to the other materials within the adjacent lines is greater than four. In further embodiments, the other materials within the adjacent lines include at least one or more of silicon, silicon nitride, silicon carbon oxide, silicon oxide, and titanium nitride.

In additional embodiments, the process chemistry for the modifying further includes a fluorine-based gas. In further embodiments, the fluorine-based gas is nitrogen trifluoride (NF3), and a percentage of the hydrogen (H2) within the process chemistry is greater than or equal to 50% with respect to an amount of the nitrogen trifluoride (NF3) within the process chemistry such that H2/(H2+NF3)≥0.5.

For one embodiment, a method to etch silicon nitride in a multi-color structure is disclosed including providing a multi-color structure formed on an underlying layer and performing a cyclic etch. The multi-color structure includes adjacent lines of materials including silicon nitride. The cyclic etch includes modifying a surface region of the silicon nitride within the adjacent lines to form a modified surface material using process chemistry including hydrogen, activating the modified surface material to remove the modified surface material, and repeating the modifying and activating for a number of cycles to etch the silicon nitride. The cyclic etch achieves an anisotropic etch of the silicon nitride with selectivity to other materials within the adjacent lines.

In additional embodiments, the number of cycles is selected to achieve a target etch amount for the silicon nitride. In additional embodiments, the selectivity of the silicon nitride to the other materials within the adjacent lines is greater than four.

In additional embodiments, the process chemistry for the modifying further comprises a fluorine-based gas. In further embodiments, the fluorine-based gas is nitrogen trifluoride (NF3), and a percentage of the hydrogen (H2) within the process chemistry is greater than or equal to 50% with respect to an amount of the nitrogen trifluoride (NF3) within the process chemistry such that H2/(H2+NF3)≥0.5.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 2A-2D provide an example embodiment for an anisotropic etch of silicon nitride material within a multi-color structure with selectivity to adjacent lines.

FIGS. 3A-3D provide an example embodiment for an anisotropic etch of silicon carbon nitride material within a multi-color structure with selectivity to adjacent lines.

DETAILED DESCRIPTION

Figure 1B:
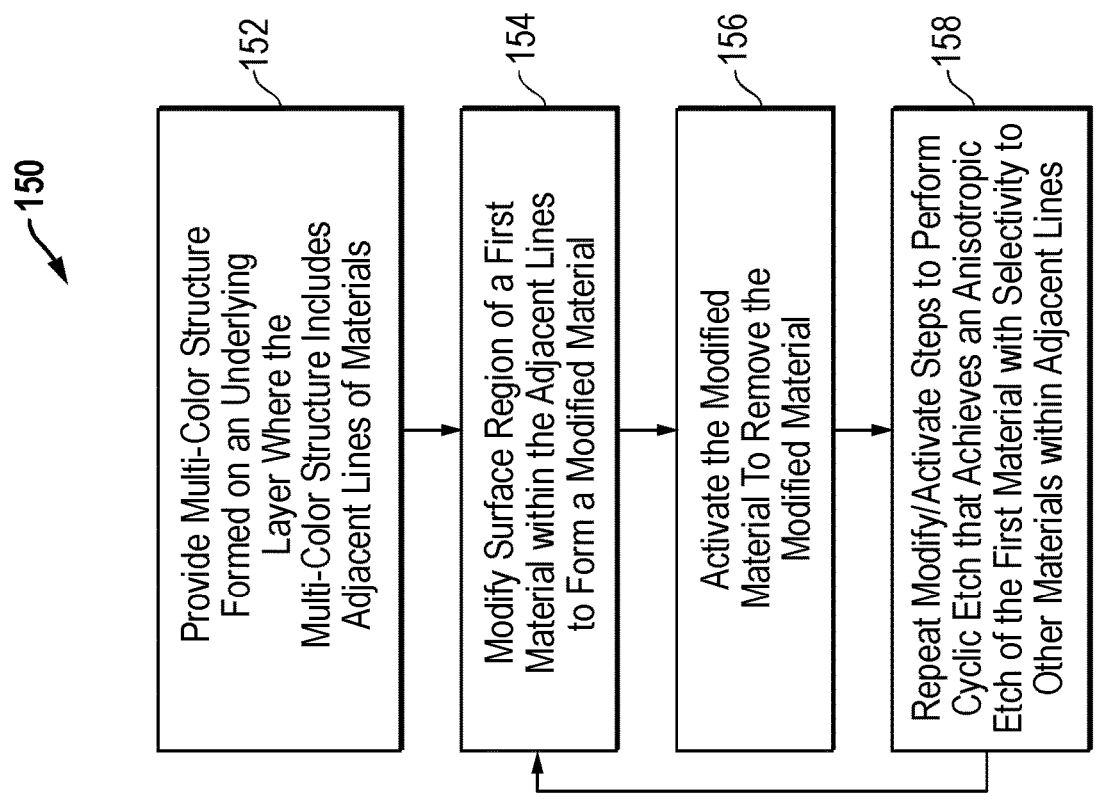
FIG. 1B is a process flow diagram of an example embodiment that uses a cyclic etch of modification/activation processes to achieve an anisotropic and selective etch of materials in adjacent lines of a multi-color structure.

As described herein, methods are disclosed for multi-color structures to etch silicon carbon nitride (SiCN) or other materials anisotropically with selectivity to adjacent materials thereby allowing for improved multi-color material processing techniques. A variety of advantages and implementations can be achieved while still taking advantage of the process techniques described herein.

Disclosed embodiments use a cyclic etch including surface modification steps and activation (removal) steps to achieve an anisotropic etch of a first material with selectivity to other materials within adjacent lines of a multi-color structure. The disclosed embodiments can be applied to a variety of process flows including self-aligned process flows, self-aligned gate-contact process flows, and/or other process flows. The disclosed embodiments can also be applied to achieve process objectives such as multi-color film selectivity for low-dielectric-constant (low-K) spacers, high levels of etch film selectivity, and/or other process objectives. For one embodiment described herein, an anisotropic etch of SiCN is achieved with selectivity to other materials in multi-color structures, such as silicon, silicon nitride (SiN, $Si_3N_4$, $Si_xN_x$), silicon carbon oxide (SiCO), silicon oxide ($SiO_2$), titanium nitride (TiN), and/or other materials. For one embodiment described herein, an anisotropic etch of silicon nitride is achieved with selectivity to other materials in multi-color structures, such as silicon, silicon carbon nitride, silicon carbon oxide, silicon oxide, titanium nitride, and/or other materials.

For disclosed embodiments, the cyclic surface modification and activation steps achieve an anisotropic etch profile with selectivity to other materials within the multi-color structure. For one embodiment, the process chemistry includes a high percentage of hydrogen ($H_2$) to facilitate surface modification of the SiCN or other layer. For this surface modification process, the percentage of hydrogen in the process chemistry is preferably greater than or equal to 50 percent with respect to a non-corrosive gas, such as a fluorine-base gas, also included within the process chemistry. For one embodiment, the process chemistry for surface modification also includes nitrogen trifluoride ($NF_3$), and the $NF_3/H_2$ chemistry modifies the surface of the SiCN material. This surface modification process is followed by an activation process to remove the modified surface region for the SiCN or other material. The surface modification and activation processes are then repeated in multiple cycles to etch the SiCN material or other material to a target amount, and this etch is anisotropic with selectivity to other materials within the multi-color structure. It noted that application of the surface modification step alone or application of the activation step alone will not achieve the desired etch parameters for SiCN or other material within the multi-color structure. However, using the cyclic process described herein, an anisotropic etch profile is achieved with adequate selectivity. It is further noted that traditional fluorine-based etch chemistries are not able to achieve both anisotropic and selective etch results. However, the disclosed embodiments provide a combination of techniques to achieve both anisotropy and selectivity using fluorine-based and/or other process chemistry.

Figure 1A:
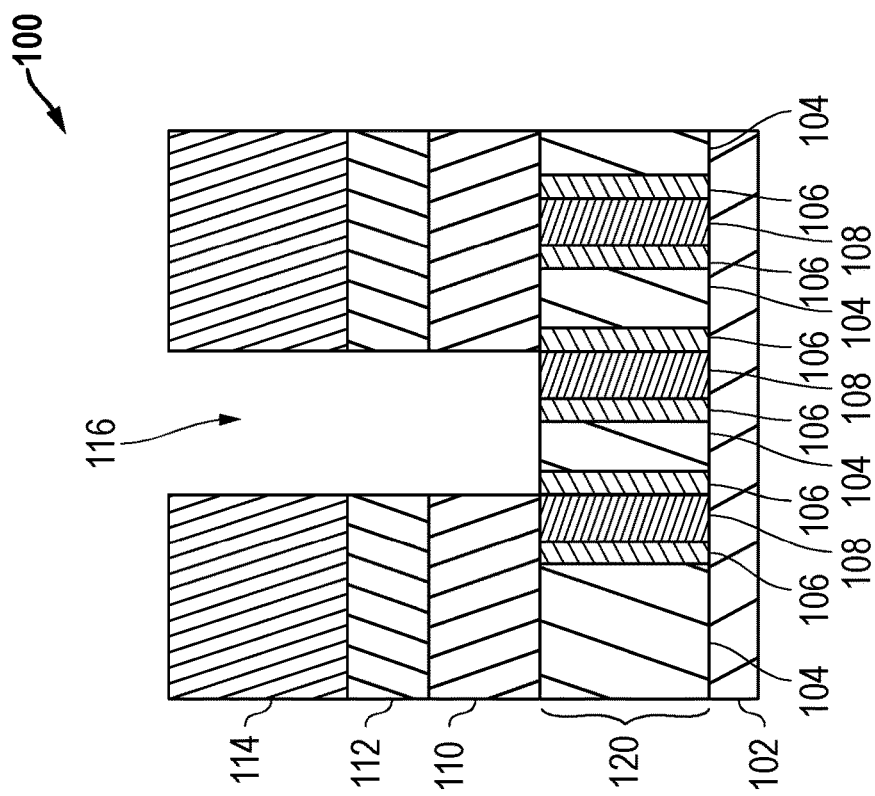
FIG. 1A is a cross-section diagram of an example embodiment including a multi-color structure having different materials within adjacent lines.
Figure 3B:
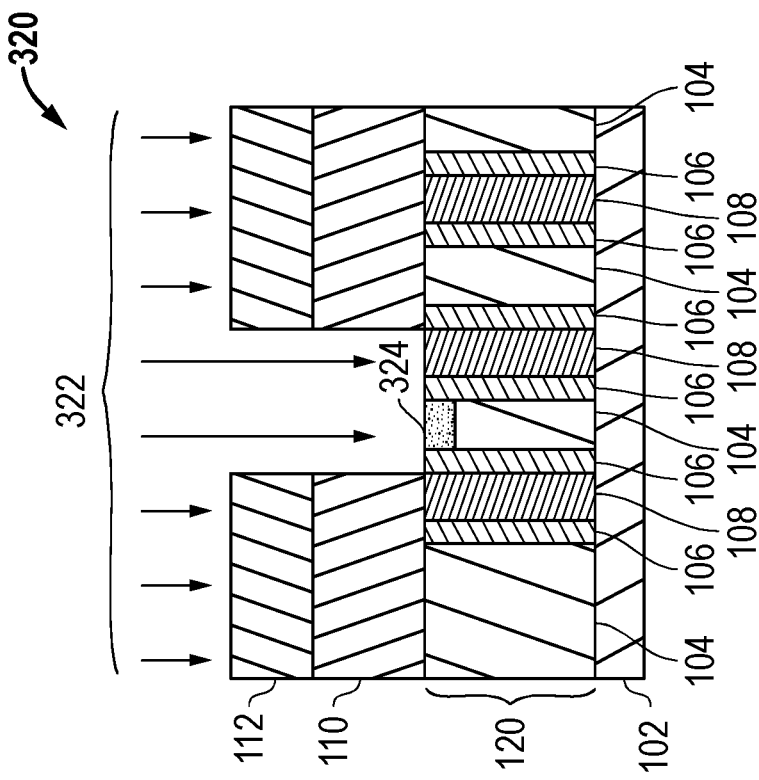

Example embodiments that apply cyclic surface modification and activation steps to achieve an selective and anisotropic etch of different materials within adjacent lines for a multi-color structure are now described in more detail with respect to the drawings. FIG. 1A provides an example multi-color structure. FIG. 1B provides a general process flow diagram that applies a cyclic etch including modification and activation steps to achieve an anisotropic etch of a first material with selectivity to other materials within adjacent lines. FIGS. 2A-2D provide an anisotropic etch of silicon nitride material within a multi-color structure with selectivity to different materials in adjacent lines. FIGS. 3A-3D provide an anisotropic etch of SiCN material within a multi-color structure with selectivity to different materials in adjacent lines. FIG. 4 is a diagram of how changes to hydrogen content within the etch chemistry is used to facilitate the surface modification process described herein.

Looking first to FIG. 1A, a cross-section diagram is provided of an example embodiment 100 including a multi-color structure 120. For the example embodiment 100, the multi-color structure 120 includes a SiCN material 104, for example, as may be used in a self-aligned gate contact process. The patterned structure for embodiment 100 also includes a spin-on-carbon (SOC) layer 114 and a TiN layer 112 formed over an oxide ($SiO_2$) layer 110. A via 116 has been opened through the SOC layer 114, the TiN layer 112, and the oxide layer 110. For one embodiment, the thickness of the SOC layer is 100 nanometers (nm); the thickness of the TiN layer is 20 nm; and the thickness of the $SiO_2$ layer is 50 nm. It is noted, however, that these thickness are provide only as examples and other thicknesses can be used. The via 116 exposes a portion of the multi-color structure 120. The multi-color structure 120 is formed between the oxide layer 110 and an underlying layer 102. The underlying layer 102 can be a substrate for a microelectronic workpiece, such as a silicon substrate, can be a layer within a patterned structure for a microelectronic workpiece, and/or another material or combination of materials.

For the example embodiment 100 shown in FIG. 1A, the multi-color structure 120 includes SiCN material 104, SiCO material 106, and silicon nitride material 108. For one embodiment, the SiCO material 106 provides sidewall spacers (SWS); the $Si_3N_4$ material 108 provides gate plugs (GP); and the SiCN material 104 provides contact plugs (CP). It is also noted that contact plugs can also be formed with silicon carbide (SiC), $SiO_2$, silicon (oxy)carbonitride (SiCN(O)), and/or other materials. Varying percentages of these materials can also be used in combination. It is also noted that where SiCN material is used, (SiC) can also be formed and used where no nitrogen content is included. Other variations can also be implemented to form a multi-color structure while still taking advantage of the techniques described herein.

FIG. 1B is a process flow diagram of an example embodiment 150 that uses a cyclic etch of modification/activation processes to achieve an anisotropic and selective etch of materials in adjacent lines of a multi-color structure. In block 152, a multi-color structure is provided, and the multi-color structure is formed on an underlying layer. The multi-color structure includes adjacent lines of materials. In block 154, a surface region of a first material within the adjacent lines is modified to form a modified surface material. In block 156, the modified surface material is activated to remove the modified surface material. In block 158, the modification and activation processes in blocks 154 and 156 are repeated to perform a cyclic etch that achieves an anisotropic etch of the first material with selectivity to other materials within adjacent lines. As described herein, the number of cycles can also be selected to achieve a target etch amount for the first material. Different and/or additional process steps can also be performed while still taking advantage of the techniques described herein.

FIGS. 2A-2D provide an example embodiment for an anisotropic etch of a silicon nitride material 108 within a multi-color structure 120 with selectivity to adjacent lines. This etch process, such as a gate plug (GP) etch process, is performed using cyclic surface modification and activation processes as described herein. As shown in FIGS. 2A-2D, this etch process removes the silicon nitride material 108 that is exposed within the via 116, and this removal provides an anisotropic etch with selectivity to other materials within the multi-color structure 120. It is noted that for this etch process, the via 116 has been previously opened through the TiN layer 112 and the $SiO_2$ layer 110 and exposes multiple materials within the multi-color structure 120.

Looking now to FIG. 2A, a cross-section diagram is provided of an example embodiment 200 showing a patterned structure with a via 116 that has been provided for processing. This patterned structure matches embodiment 100 in FIG. 1A with the SOC layer 114 being removed. The embodiment 200 includes multi-color structure 120 that has adjacent lines of SiCN material 104, SiCO material 106, and silicon nitride material 108. A portion of the multi-color structure 120 is exposed within the via 116 including silicon nitride material 108 to be etched as shown in FIGS. 2B-2D.

FIG. 2B is a cross-section diagram of an example embodiment 220 after a modification process has been performed to modify a surface region 224 of the silicon nitride material 108 within the exposed portion of the multi-color structure 120. This surface modification is performed using a first chemistry 222 that is applied to the patterned structure and the exposed portion of the multi-color structure 120. For one embodiment, the first chemistry 222 is applied to the patterned structure within a process chamber using one or more delivery systems.

FIG. 2C is a cross-section diagram of an example embodiment 240 after an activation process has been performed to remove the modified surface material within the surface region 224 shown in FIG. 2B. As indicated by arrow 244, this modified surface material is removed by application of a second chemistry 242 to the patterned structure to activate and remove the modified surface material within the exposed portion of the multi-color structure 120. For one embodiment, the second chemistry 242 is applied to the patterned structure within a process chamber using one or more delivery systems.

The modification process of FIG. 2B and the activation process of FIG. 2C are then repeated to perform a cyclic etch of the silicon nitride material 108 within the exposed portion of the multi-color structure 120. This cyclic etch achieves an anisotropic etch of silicon nitride material 108 with selectivity to other materials within the exposed portion of the multi-color structure 120.

FIG. 2D is a cross-section diagram of an example embodiment 250 after completion of the cyclic etch using the modification process in FIG. 2B and the activation process in FIG. 2C. Once completed, the silicon nitride material 108 has been removed as indicated by arrow 252. It is further noted that rather than complete removal of the target material, such as the silicon nitride material 108, the number of cycles can be selected to achieve a target etch amount for the target material.

FIGS. 3A-3D provide an example embodiment for an anisotropic etch of SiCN material 104 within a multi-color structure 120 with selectivity to adjacent lines. This etch process, such as a contact plug (CP) etch process, is performed using cyclic surface modification and activation processes as described herein. This etch process removes the SiCN material 104 that is exposed within the via 116, and this removal provides an anisotropic etch with selectivity to other materials within the multi-color structure 120. It is noted that for this etch process, the via 116 has been previously opened through the TiN layer 112 and the $SiO_2$ layer 110 and exposes multiple materials within the multi-color structure 120.

Figure 3A:
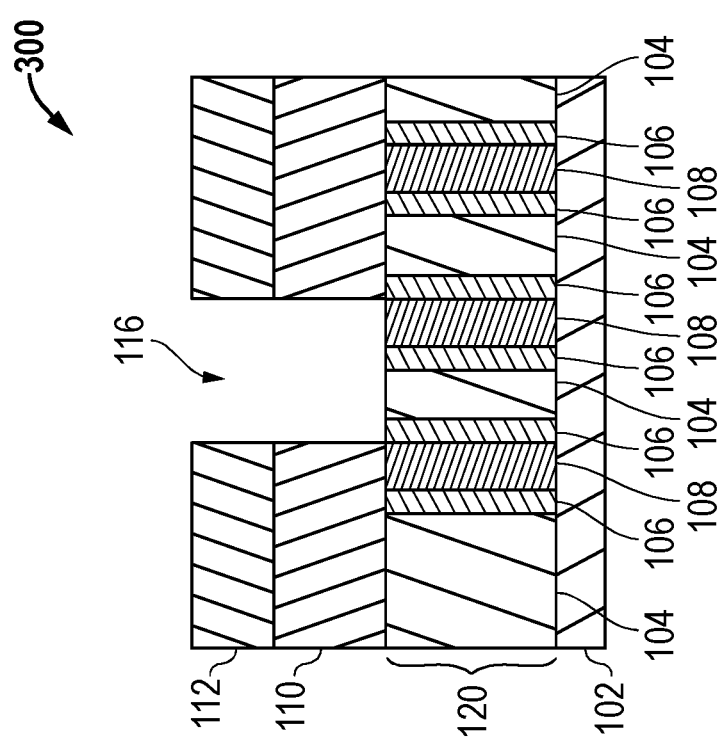
Figure 4:
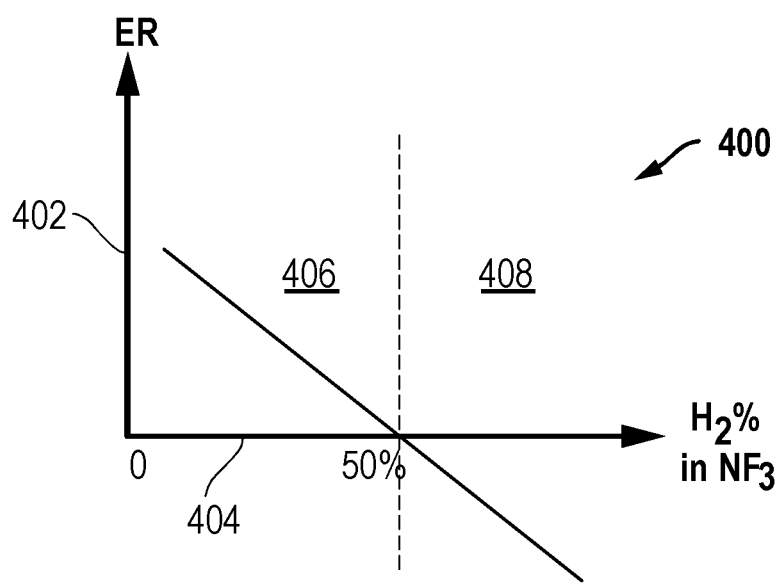
FIG. 4 is a representative diagram showing adjustments to surface modification based upon changes in the percentage of hydrogen within the process chemistry.

Looking now to FIG. 3A, a cross-section diagram is provided of an example embodiment 300 showing a patterned structure with a via 116 that has been provided for processing. This patterned structure matches embodiment 200 in FIG. 2A and matches embodiment 100 in FIG. 1A with the SOC layer 114 being removed. The embodiment 300 includes multi-color structure 120 that has adjacent lines of SiCN material 104, SiCO material 106, and silicon nitride material 108. A portion of the multi-color structure 120 is exposed within the via 116 including SiCN material 104 to be etched as shown in FIGS. 3B-3D.

FIG. 3B is a cross-section diagram of an example embodiment 320 after a modification process has been performed to modify a surface region 324 of the SiCN material 104 within the exposed portion of the multi-color structure 120. This surface modification is performed using a first chemistry 322 that is applied to the patterned structure and the exposed portion of the multi-color structure 120. For one embodiment, the first chemistry 322 is applied to the patterned structure within a process chamber using one or more delivery systems.

FIG. 3C is a cross-section diagram of an example embodiment 340 after an activation process has been performed to remove the modified surface material within the surface region 324 shown in FIG. 3B. As indicated by arrow 344, this modified surface material is removed by application of a second chemistry 342 to the patterned structure to activate and remove the modified surface material. For one embodiment, the second chemistry 342 is applied to the patterned structure within a process chamber using one or more delivery systems.

The modification process of FIG. 3B and the activation process of FIG. 3C are then repeated to perform a cyclic etch of the SiCN material 104 within the exposed portion of the multi-color structure 120. This cyclic etch achieves an anisotropic etch of SiCN material 104 with selectivity to other materials within the exposed portion of the multi-color structure 120.

FIG. 3D is a cross-section diagram of an example embodiment 350 after completion of the cyclic etch using the modification process in FIG. 3B and the activation process in FIG. 3C. Once completed, the SiCN material 104 has been removed as indicated by arrow 352. It is further noted that rather than complete removal of the target material, such as the SiCN material 104, the number of cycles can be selected to achieve a target etch amount for the target material.

For one example embodiment, process conditions for the surface modification process of FIG. 3B include: pressure of 200 millitorrs (mTorr), power of 100 Watts (W) for an upper electrode and 0 W for a lower electrode for a process chamber, duration of 3 seconds, and a process chemistry including 30 cubic centimeters (cc) of $NF_3$, 50 cc of $H_2$, and 1100 cc of argon (Ar). For one example embodiment, process conditions for the activation process of FIG. 3C include: pressure of 30 mTorr, power of 100 W for an upper electrode and 10 W for a lower electrode for a process chamber, duration of 4 seconds, and chemistry including 1100 cc of Ar. It is further noted that purge steps can be included between the surface modification and activation processes, although purge steps are not required to be used.

For one embodiment, fifty cycles are performed of the modification/activation processes of FIGS. 3B-3C to etch about 45 nanometers (nm) of the SiCN material. As described herein, the number of cycles used for the cyclic processing can be adjusted to achieve a target etch amount. For one embodiment, the number of cycles is greater than or equal to 50 cycles.

It is further noted that the process conditions and parameters indicated herein can be operable within ranges rather than single values. Still further, process conditions such as pressure in the chamber, chamber temperature, gas temperature, and/or other operating variables can be modulated and controlled in order to adjust the amount of material etched or activated per cycle. Additional variations can be implemented.

FIG. 4 is a representative diagram 400 showing adjustments to surface modification based upon changes in the percentage of hydrogen ($H_2$) within the process chemistry. The vertical axis represents etch rate (ER), and the horizontal axis 404 represents the percentage of hydrogen with respect to nitrogen trifluoride ($NF_3$), which is also used for the process chemistry. When the percentage of hydrogen is below fifty percent (50%) with respect to the amount of $NF_3$ within the process chemistry (e.g., $H_2/(H_2+NF_3)<0.5$), an isotropic etch region 406 is achieved that is not preferable for surface modification. When the percentage of hydrogen is greater than or equal to 50% with respect to the amount of $NF_3$ within the process chemistry (e.g., $H_2/(H_2+NF_3) \geq 0.5$), a deposition region 408 is achieved that is preferable for a surface modification process. As shown, therefore, the percentage of hydrogen can be adjusted in the process chemistry to achieve the desired region 408 for the surface modification process where the hydrogen percentage is greater than or equal to 50% with respect to the amount of $NF_3$ within the process chemistry. It is noted that another fluorine-based gas could also be used instead of nitrogen trifluoride. It is also noted that for the subsequent activation process, the process chemistry can include nitrogen ($N_2$), argon (Ar), or other noble gas. It is further noted that this process chemistry for the activation process can be similar to what is typically used for activation in atomic layer deposition (ALD) and/or atomic layer etch (ALE) processes.

For one application of these techniques, an anisotropic etch of SiCN material can be achieved using cyclic techniques of surface modification (high hydrogen percentage) to modify the surface region for the SiCN followed by activation to remove the modified surface material within the surface region for the SiCN. Using this technique, medium selectivity was achieved for SiCN with respect to different materials including TiN, $SiO_2$, Si, SiN, and SiCO. For example, selectivity of SiCN with respect to SiN was greater than four (4), and selectivity of SiCN with respect to the SWS material (e.g., SiCO) was greater than four (4). As indicated above, a high percentage of hydrogen ($H_2$) can be included within the surface-modification (deposition) process chemistry for surface modification of the SiCN, which creates a modified surface material with a surface region for the SiCN. The modified surface material, for example, can be a salt, such as ammonium fluorosilicate (($NH_4)_2SiF_6$), and/or other material or combination of materials. Further, a non-corrosive gas, such as $NF_3$ or other fluorine-based gas, can be used for the process chemistry, and hydrogen can be added to this non-corrosive gas. The percentage of hydrogen is increased to greater than or equal to 50% with respect to this non-corrosive gas to cause surface-modification of the SiCN at the surface region for the SiCN. The activation or removal of the modified surface material can be achieved using $N_2$, Ar, and/or another noble gas as the process chemistry. It is again noted that the cyclic etch process and related techniques described herein can also be used to achieve an anisotropic and selective etch of materials other than SiCN or silicon nitride within multi-color structures. Other variations can also be implemented while still taking advantage of the techniques described herein.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method, comprising:
    providing a multi-color structure formed on an underlying layer, the multi-color structure comprising adjacent lines of materials; and
    performing a cyclic etch, comprising:
        modifying a surface region of a first material within the adjacent lines to form a modified surface material with a process gas comprising hydrogen and a fluorine-based gas;
        activating the modified surface material with a plasma etch to remove the modified surface material; and
        repeating the modifying and activating for a number of cycles to etch the first material;
        wherein the cyclic etch achieves an anisotropic etch of the first material with selectivity to other materials within the adjacent lines.

2. The method of claim 1, wherein the number of cycles is selected to achieve a target etch amount for the first material.

3. The method of claim 2, wherein the number of cycles is greater than or equal to fifty.

4. The method of claim 1, wherein the first material comprises silicon carbon nitride.

5. The method of claim 4, wherein the selectivity of the silicon carbon nitride to the other materials within the adjacent lines is greater than four.

6. The method of claim 5, wherein the other materials within the adjacent lines comprise at least one or more of silicon, silicon nitride, silicon carbon oxide, silicon oxide, and titanium nitride.

7. The method of claim 6, further including performing the modifying and the activating with the plasma etch of the first material through a via with the first material exposed at a bottom of the via, and the at least one or more of silicon, silicon nitride, silicon carbon oxide, silicon oxide and titanium oxide is exposed at the bottom of the via during the modifying and the activating with the plasma etch, and
wherein the via extends through plural layers including a silicon containing layer and a titanium containing layer.

8. The method of claim 1, wherein the process chemistry for the activating comprises at least one of nitrogen, argon, or another noble gas.

9. The method of claim 1, wherein the fluorine-based gas is nitrogen trifluoride ($NF_3$), and wherein a percentage of the hydrogen ($H_2$) within the process chemistry is greater than or equal to 50% with respect to an amount of the nitrogen trifluoride ($NF_3$) within the process chemistry such that $H_2/(H_2+NF_3) \geq 0.5$.

10. The method of claim 1, wherein the modified surface material comprises a salt.

11. A method to etch silicon carbon nitride (SiCN) in a multi-color structure, comprising:
providing a multi-color structure formed on an underlying layer, the multi-color structure comprising adjacent lines of materials including SiCN; and
performing a cyclic etch, comprising:
modifying a surface region of the SiCN within the adjacent lines to form a modified surface material using process chemistry including hydrogen and a fluorine-based gas;
activating the modified surface material with a plasma etch to remove the modified surface material; and
repeating the modifying and activating for a number of cycles to etch the SiCN;
wherein the cyclic etch achieves an anisotropic etch of the SiCN with selectivity to other materials within the adjacent lines.

12. The method of claim 11, wherein the selectivity of the SiCN to the other materials within the adjacent lines is greater than four.

13. The method of claim 12, wherein the other materials within the adjacent lines comprise at least one or more of silicon, silicon nitride, silicon carbon oxide, silicon oxide, and titanium nitride.

14. The method of claim 11, wherein the fluorine-based gas is nitrogen trifluoride ($NF_3$), and wherein a percentage of the hydrogen ($H_2$) within the process chemistry is greater than or equal to 50% with respect to an amount of the nitrogen trifluoride ($NF_3$) within the process chemistry such that $H_2/(H_2+NF_3) \geq 0.5$.

15. The method of claim 11, further including performing the modifying and the activating with the plasma etch of the SiCN through a via with the SiCN exposed at a bottom of the via,
wherein the via extends through plural layers including at least one silicon containing layer and at least one titanium containing layer, and
wherein the other materials within the lines comprise at least one or more of silicon, silicon nitride, silicon carbon oxide, silicon oxide, and titanium nitride exposed at the bottom of the via during the modifying and the activating with the plasma etch of the SiCN.

16. A method to etch silicon nitride in a multi-color structure, comprising:
providing a multi-color structure formed on an underlying layer, the multi-color structure comprising adjacent lines of materials including silicon nitride; and
performing a cyclic etch, comprising:
modifying a surface region of the silicon nitride within the adjacent lines to form a modified surface material using process chemistry including hydrogen and a fluorine-based gas;
activating the modified surface material to remove the modified surface material; and
repeating the modifying and activating for a number of cycles to etch the silicon nitride;
wherein the cyclic etch achieves an anisotropic etch of the silicon nitride with selectivity to other materials within the adjacent lines.

17. The method of claim 16, wherein the number of cycles is selected to achieve a target etch amount for the silicon nitride.

18. The method of claim 16, wherein the selectivity of the silicon nitride to the other materials within the adjacent lines is greater than four.

19. The method of claim 16, wherein the fluorine-based gas is nitrogen trifluoride ($NF_3$), and wherein a percentage of the hydrogen ($H_2$) within the process chemistry is greater than or equal to 50% with respect to an amount of the nitrogen trifluoride ($NF_3$) within the process chemistry such that $H_2/(H_2+NF_3) \geq 0.5$.

20. The method of claim 19, wherein the other materials include at least one of SiCN or SiCO, the at least one of SiCN or SiCO is exposed during the anisotropic etch of the silicon nitride, and the silicon nitride is selectively etched with respect to the at least one of SiCN or SiCO.

21. The method of claim 20, further including performing the modifying and the activating of the silicon nitride through a via in which the silicon nitride is exposed at a bottom of the via, and the at least one of SiCN or SiCO is exposed at the bottom of the via during the modifying and the activating of the silicon nitride.

22. The method of claim 16, further including performing the modifying and the activating of the silicon nitride through a via in which the silicon nitride is exposed at a bottom of the via.

23. The method of claim 22, wherein the via extends through plural layers and the plural layers include at least one titanium containing layer and at least one silicon containing layer, and wherein the at least one of SiCN or SiCO is exposed at the bottom of the via and the silicon nitride is selectively etched with respect to the at least one of SiCN or SiCO.

24. The method of claim 22, wherein a percentage of hydrogen within the process gas chemistry is equal to or greater than 50% with respect to an amount of the fluorine-based gas.

* * * * *